United States Patent [19]
Forster et al.

[11] Patent Number: 5,144,593
[45] Date of Patent: Sep. 1, 1992

[54] INTEGRATED AUTOMATIC CONTROL FOR ULTRASONIC PROXIMITY SWITCHES

[75] Inventors: Alfred Forster, Schwandorf; Robert Schwarz, Freudenberg, both of Fed. Rep. of Germany

[73] Assignee: Siemens Aktiengesellschaft, Berlin & Munich, Fed. Rep. of Germany

[21] Appl. No.: 788,037

[22] Filed: Nov. 5, 1991

[30] Foreign Application Priority Data

Nov. 5, 1990 [EP] European Pat. Off. ............ 90121129

[51] Int. Cl.[5] .............................................. G01S 15/00
[52] U.S. Cl. ........................................................ 367/95
[58] Field of Search ................... 367/95, 96, 137, 93, 367/87

[56] References Cited

U.S. PATENT DOCUMENTS 3,863,196  1/1975  Hilles ...................................... 367/96
4,347,592  8/1982  Langeraar ............................ 367/137

FOREIGN PATENT DOCUMENTS

WO80/00497  3/1980  PCT Int'l Appl. .

*Primary Examiner*—Daniel T. Pihulic
*Attorney, Agent, or Firm*—Kenyon & Kenyon

[57] ABSTRACT

The transmitting pulse required to operate an ultrasonic proximity switch is usually generated externally in separate evaluation electronics. This requires additional circuitry, either analog or digital circuits, or a microprocessor and associated software. In the case of ultrasonic proximity switches, which have an integrated circuit with transmitting oscillator, the generation of the transmitting pulse is performed by additional means provided on the integrated circuit for generating a transmitting clock pulse. By means of a control signal, it is possible to select between the operation with this transmitting clock pulse and a transmitting clock pulse supplied externally by the evaluation electronics.

16 Claims, 2 Drawing Sheets

INTEGRATED AUTOMATIC CONTROL FOR ULTRASONIC PROXIMITY SWITCHES

BACKGROUND OF THE INVENTION

The present invention relates generally to ultrasonic proximity switches, and more particularly to an ultrasonic proximity switch having a transmitting oscillator, whose transmitting frequency is periodically modulated by a first transmitting clock pulse for a constant transmitting time to a transmitting stage.

DE 27 21 254 discloses such an ultrasonic proximity switch. Usually, ultrasonic proximity switches are connected to evaluation electronics, which evaluate the transmitting and receiving signal of the ultrasonic proximity switch. Up until now, the procedure had been to generate the transmitting clock pulse in the evaluation electronics and to then feed it to the ultrasonic proximity switch. This entailed additional circuitry in order to produce the transmitting clock pulse. In terms of hardware, this additional circuitry was either analog or digital circuits, or software combined with a microprocessor.

The present invention is directed to the problem of developing an ultrasonic proximity switch having a transmitting oscillator, whose transmitting frequency is periodically modulated by a first transmitting clock pulse for a constant transmitting time to a transmitting stage without the need for additional circuitry and thereby reducing the related expenditure.

SUMMARY OF THE INVENTION

The present invention solves this problem by providing a transmitting oscillator as a component part of an integrated circuit and by providing the circuit with a first input for picking up the first transmitting clock pulse, a second input for picking up a control signal, and internal means for generating a second transmitting clock pulse. Here, the control signal renders possible a two-way switchover between the internal and external clocking of the transmitting frequency.

This solution makes it possible to get by with a simplified evaluation electronics, which itself does not generate any transmitting clock pulse. Instead, the required transmitting clock pulse is generated in a simple and cost-saving manner with the help of the integrated circuit in the proximity switch itself.

A particularly simple design is achieved when the means for generating the second transmitting clock pulse has a counting circuit, which counts the pulses of the transmitting frequency of the transmitting oscillator. Advantageously, the counting circuit has at least one dead-time counter and one transmitting-time counter.

To achieve an optimum adaptation to the existing environmental conditions, it proves to be expedient when the counters for the transmitting time and the cycle time of the transmitting clock pulse are capable of being adjusted separately. If, in addition to a first changeover switch for switching between internal and external clocking, a second changeover switch is provided, which in accordance with the clock-pulse status enables two different signals to be fed to an output of the integrated circuit, then variables which characterize the clock-pulse status, for example, can be transmitted to the evaluation electronics.

Given internal clocking, it is beneficial for the second transmitting clock pulse to be applied to the output. If the integrated circuit has a device, with whose help a temperature pulse can be generated which represents the surrounding air temperature, then the influence of the echo delay time which is dependent on temperature can be compensated for in the evaluation electronics with this temperature pulse. It proves to be beneficial, when the temperature pulse is applied to the output in the case of external clocking.

DETAILED DESCRIPTION

Figure 1:
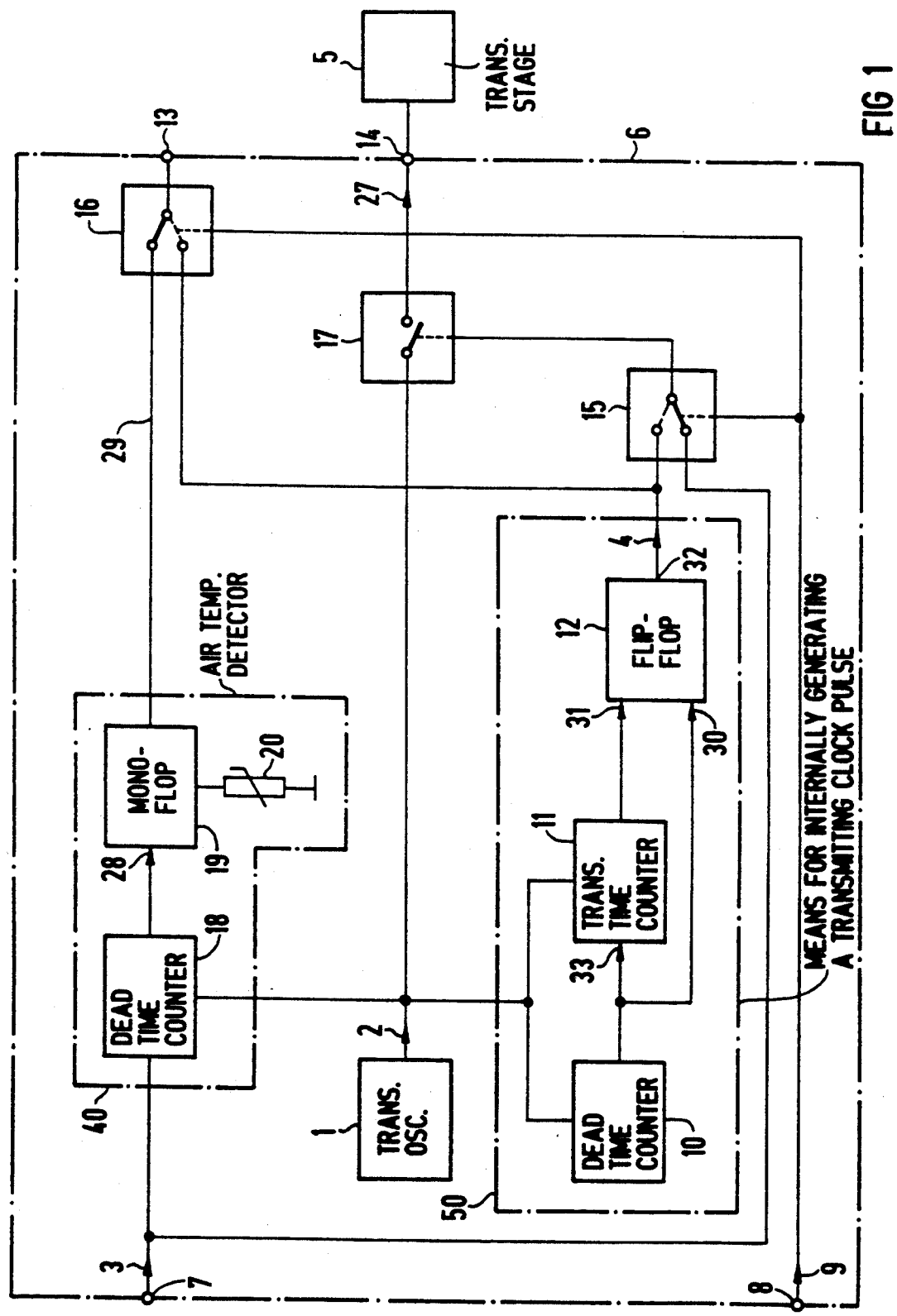
FIG. 1 depicts a block diagram of an integrated circuit including components of the present invention.
Figure 2:
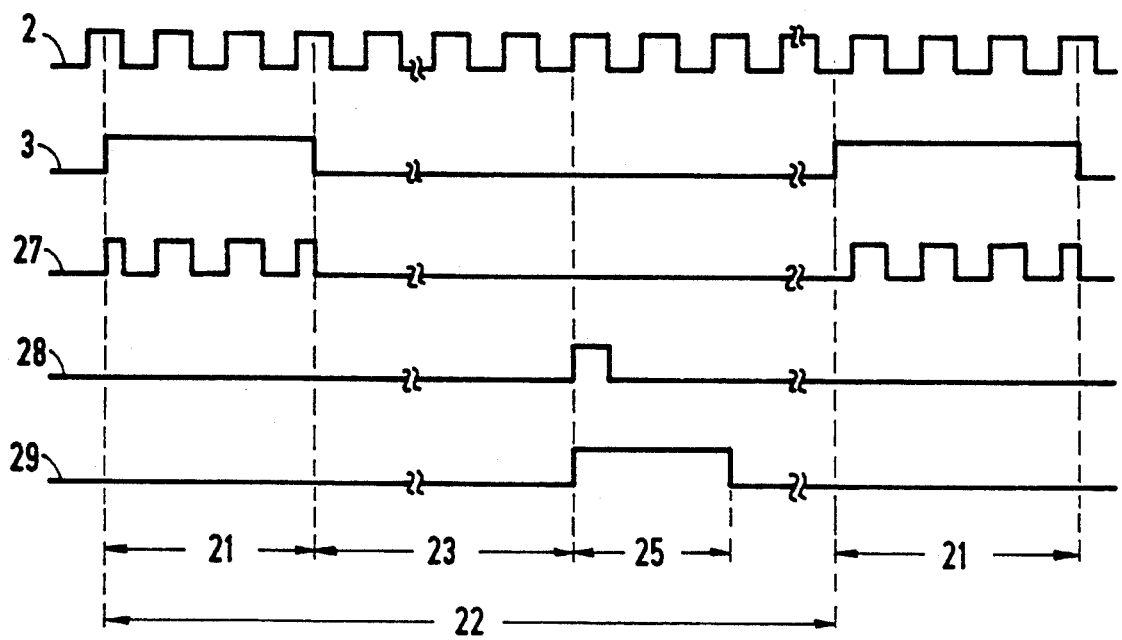
FIG. 2 is a pulse diagram for external clocking.

FIG. 1 depicts an integrated circuit 6 including the important components of the present invention. The integrated circuit 6 shows two inputs 7, 8 and two outputs 13, 14. It comprises a transmitting oscillator 1, which generates a transmitting frequency 2, two changeover switches 15, 16, a switch 17, as well as a device for detecting air temperature 40, and means 50 for internally generating a transmitting clock pulse 4. The means 50 for internally generating comprises a dead-time counter 10, a transmitting-time counter 11, and a flip-flop 12. The device for detecting temperature 40 is realized in this embodiment of the present invention by a dead-time counter 18 and a mono-flop 19 in conjunction with a negative temperature coefficient (NTC) thermistor 20. The input 7 of the integrated circuit 6 is electrically connected to the changeover switch 15 and to the dead-time counter 18. The other input 8 is linked to the control inputs of the changeover switches 15 and 16. The switch 17 is coupled between the transmitting oscillator 1 and the output 14. A transmission stage 5 is able to be connected from the outside to this output 14. By applying an appropriate control pulse 9 to the input 8 of the circuit 6, an external or internal clocking can be optionally achieved. In the case of external clocking, the changeover switch 15 is actuated in such a way that a transmitting clock pulse 3 fed from the outside to the input 7 is routed to the switch 17, so that this switch 17 applies the transmitting frequency 2 supplied by the transmitting oscillator 1 to the transmitting stage 5 for corresponding cycle times of the transmitting clock pulse 3. Accordingly, a transmitting pulse 27 according to FIG. 2 is transmitted from the output of the switch 17 to the transmission stage 5. Furthermore, one can conclude from FIG. 1, that in the external clocking state, the changeover switch 16 is actuated in such a way that a temperature pulse 29 supplied from the device for detecting temperature is routed according to FIG. 1 to the output 13. The temperature pulse 29 is synchronized by means of the dead-time counter 18, which starts up at the same time as the trailing edge of the transmission time 21 of the transmitting clock pulse 3. The dead-time counter 18 counts a specified number of pulses of the transmitting frequency 2 fed to it from the transmitting oscillator 1. After the expiration of a dead time 23, the dead-time counter 18 emits a trigger pulse 28, by means of which a mono-flop 19 is started. On the basis of corresponding circuit elements, for example when an NTC thermistor 20 is applied, the mono-flop 19 emits a correspondingly wide temperature pulse 29 of the pulse length 25 at the output. From here, the temperature pulse 29 is routed to the output 13 of the circuit 6 via the changeover switch 16 which is switched through.

Figure 3:
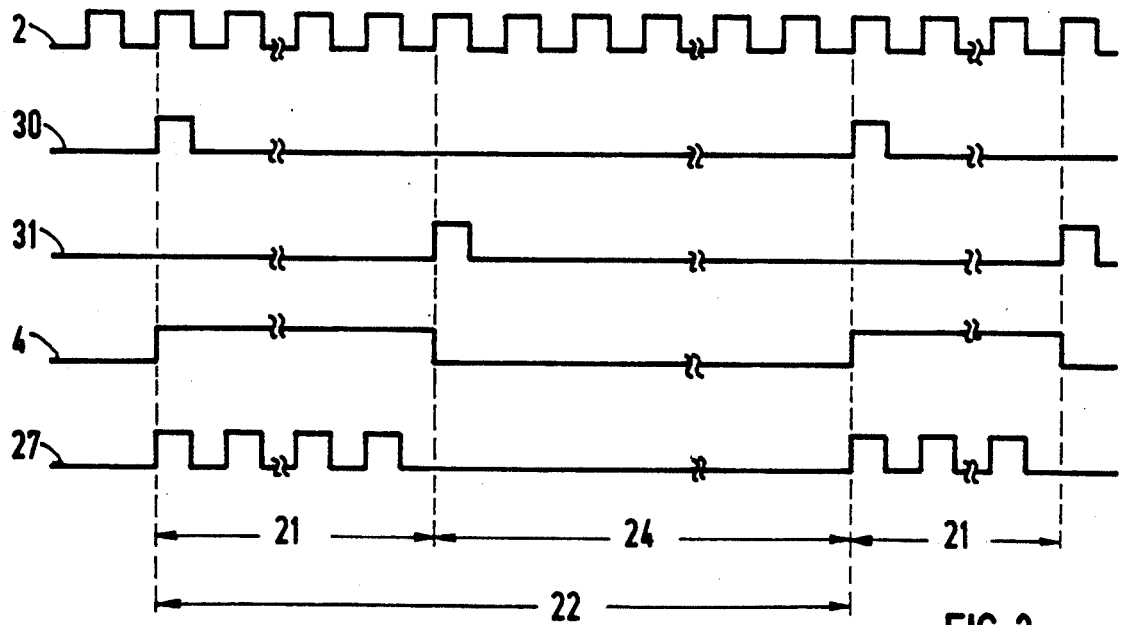
FIG. 3 is a pulse diagram for internal clocking.

The switchover to internal clocking is effected by means of the control signal 9 at the input 8, which results in a change in the state of the two changeover switches 15 and 16. Now, a second transmitting clock pulse 4, which is generated by the dead-time counter 10, the transmitting-time counter 11 and the flip-flop 12, is fed via the changeover switch 15 to the switch 17. Usually, the transmitting clock pulse 4 corresponds to the transmitting clock pulse 3, so that in both cases the same transmitting pulse 27 is applied according to FIG. 2 and 3 to the output 14 of the circuit 6. The transmitting clock pulse 4 is generated, in the case of internal clocking, starting from the free-running transmitting oscillator 1, whose transmitting frequency is supplied to the input of the dead-time counter 10 and to the input of the transmitting-time counter 11. The dead-time counter 10 for the dead time 24 according to FIG. 3 is free-running. After the dead time 24 according to FIG. 3, when the adjusted counter content of the dead-time counter 10 is reached, a set pulse 30 is transmitted to the flip-flop 12, with which the Q-output 32 of the flip-flop 12 is activated. At the same time, the transmitting-time counter 11 is triggered via a start input 33 and is likewise clocked by the transmitting oscillator 1. After the expiration of the transmitting time 21 according to FIG. 3, a reset pulse 31 applied to the flip-flop 12 from the transmitting time counter causes its Q-output 32 to be disabled. The transmitting clock pulse 4 generated in this manner attains the output 13 via the changeover switch 16 and is drawn upon for synchronizing an external evaluation circuit. Furthermore, a third changeover switch could be provided as an alternative. In the case of external clocking, the third changeover switch connects the input 7 to the counter 18. However, when switching over to internal clocking, the internal transmitting clock pulse 4 would have to be applied via this third changeover switch to the counter 18, making it possible at this point to generate the temperature pulse 29 so that it is synchronized in this case as well. In this case, another output of the circuit 6 would have to be made available, which enables an evaluation electronics, for example, to receive the temperature pulse 29.

What is claimed is:

1. An ultrasonic proximity switch, comprising: an integrated circuit including:
   a) a first input receiving a first transmitting clock pulse;
   b) a second input receiving a control signal;
   c) a means for generating a second transmitting clock pulse;
   d) a transmitting oscillator having a transmitting frequency; and
   e) means responsive to said control signal, for switching between internal and external clocking of the transmitting frequency with said first transmitting clock pulse and said second transmitting clock pulse respectively, wherein a clocking of said transmitting frequency produces an output signal for a transmission stage.

2. The ultrasonic proximity switch according to claim 1, wherein said switching means comprises a counting circuit counting pulses of the transmitting frequency of said transmitting oscillator.

3. The ultrasonic proximity switch according to claim 2, wherein said counting circuit comprises a dead-time counter and a transmitting-time counter.

4. The ultrasonic proximity switch according to claim 3, wherein said dead-time and transmitting time counters are separately adjustable.

5. The ultrasonic proximity switch according to claim 1, wherein said integrated circuit further comprises a first output and said switching means comprises:
   a) a first changeover switch switching between internal and external clocking; and
   b) a second changeover switch enabling two different signals to be fed to said first output depending upon a status of the control signal 6. The ultrasonic proximity switch according to claim 5, wherein said switching means applies the transmitting clock pulse to the first output during internal clocking.

7. The ultrasonic proximity switch according claim 1, wherein the integrated circuit further comprises a temperature detector generating a temperature pulse representing surrounding air temperature.

8. The ultrasonic proximity switch according to claim 7, wherein said switching means applies the temperature pulse to the first output during external clocking.

9. An ultrasonic proximity switch, comprising: an integrated circuit including:
   a) a first input receiving a first transmitting clock pulse;
   b) a second input receiving a control signal;
   c) a transmitting oscillator having a transmitting frequency;
   d) a generator generating a second transmitting clock pulse having an input coupled to said transmitting oscillator; and
   e) a switch responsive to said control signal, for switching between internal and external clocking of the transmitting frequency with said first transmitting clock pulse and said second transmitting clock pulse respectively, said switch having a first switch input coupled to said first input, having a second switch input coupled to said generator, and having a control input coupled to said second input, wherein a clocking of said transmitting frequency produces an output signal for a transmission stage.

10. The ultrasonic proximity switch according to claim 9, further comprising a modulator clocking said transmitting frequency having a control input coupled to said switch, having an input coupled to said transmitting oscillator and outputting a clocked transmitting frequency to a transmission stage.

11. The ultrasonic proximity switch according to claim 10, further comprising an air temperature detector coupled to said first input and receiving said transmitting frequency as an input, whereby said air temperature detector compensates for temperature dependent influences on echo delay time.

12. The ultrasonic proximity switch according to claim 11, further comprising a first two pole switch having a first switch input coupled to said air temperature detector and having a second switch input coupled to said generator receiving the second clock pulse, having a control input coupled to said second input and having an output available for external evaluation.

13. The ultrasonic proximity switch according to claim 9, wherein said switch comprises a second two pole switch.

14. The ultrasonic proximity switch according to claim 9, wherein said generator comprises:
   a) a dead time counter being coupled to the transmitting oscillator and having an output;

b) a transmitting time counter having a first input coupled to said transmitting oscillator, having a second input coupled to said dead time counter; and c) a flip-flop having a first input coupled to said transmitting time counter, having a second input coupled to said dead time counter and outputting the second clock pulse.

15. The ultrasonic proximity switch according to claim 11, wherein said air temperature detector comprises:

a) a dead time counter being coupled to said first input and having an output;

b) a mono-flop having an input coupled to said dead time counter, having a control input and outputting a temperature pulse; and c) a negative temperature coefficient thermistor coupled between said control input of the mono-flop and ground.

16. The ultrasonic proximity switch according to claim 10, wherein said modulator comprises a single pole switch.

* * * * *